US011862934B2

(12) United States Patent
Koslowski et al.

(10) Patent No.: US 11,862,934 B2
(45) Date of Patent: Jan. 2, 2024

(54) WIDELY TUNABLE, SINGLE MODE EMISSION SEMICONDUCTOR LASER

(71) Applicant: Automotive Coalition for Traffic Safety, Inc., Sterling, VA (US)

(72) Inventors: Tim Koslowski, Gerbrunn (DE); Johannes Koeth, Gerbrunn (DE); Nicolas Koslowski, Gerbrunn (DE)

(73) Assignee: Automotive Coalition for Traffic Safety, Inc., Sterling, VA (US)

( * ) Notice: Subject to any disclaimer, the term of this patent is extended or adjusted under 35 U.S.C. 154(b) by 270 days.

(21) Appl. No.: 17/222,493

(22) Filed: Apr. 5, 2021

(65) Prior Publication Data

US 2021/0313771 A1 Oct. 7, 2021

Related U.S. Application Data

(60) Provisional application No. 63/004,816, filed on Apr. 3, 2020.

(51) Int. Cl.
*H01S 5/00* (2006.01)
*H01S 5/10* (2021.01)
*H01S 5/22* (2006.01)
(Continued)

(52) U.S. Cl.
CPC .......... *H01S 5/1021* (2013.01); *H01S 5/0206* (2013.01); *H01S 5/0261* (2013.01);
(Continued)

(58) Field of Classification Search
CPC .. H01S 5/1021; H01S 5/0206; H01S 5/02476; H01S 5/0261; H01S 5/0422;
(Continued)

(56) References Cited

U.S. PATENT DOCUMENTS

2008/0025355 A1 1/2008 Hu et al.
2008/0159341 A1* 7/2008 Patel ...................... H01S 5/141
372/102
(Continued)

FOREIGN PATENT DOCUMENTS

WO  WO 2017/119944    7/2017
WO  WO 2019/211203    11/2019

OTHER PUBLICATIONS

Debrégeas, H., Widely Tunable Laser Diodes, Springer Series in Optical Sciences, Feb. 2017, vol. 161, pp. 168-177.
(Continued)

*Primary Examiner* — Kinam Park
(74) *Attorney, Agent, or Firm* — Pandiscio & Pandiscio

(57) ABSTRACT

The present invention provides a widely tunable, single mode emission semiconductor laser which comprises a semiconductor substrate, a first linear ridge waveguide which forms a first coupled cavity, and a second linear ridge waveguide which forms a second coupled cavity, with the first coupled cavity being separated from the second coupled cavity by a gap. The first and second coupled cavities comprise p-contacts and n-contacts for allowing laser currents $I_1$, $I_2$ to be injected into the first and second coupled cavities, respectively. The first and second coupled cavities comprise first and second heating resistors, respectively, for heating the first and second coupled cavities when heating currents $H_1$, $H_2$ are applied to the first and second heating resistors, respectively. A heating resistor is provided for heating the semiconductor substrate of the semiconductor laser so as to regulate the base temperature T of the chip (i.e., the semiconductor substrate).

21 Claims, 16 Drawing Sheets

(51) Int. Cl.
  *H01S 5/026* (2006.01)
  *H01S 5/02* (2006.01)
  *H01S 5/024* (2006.01)
  *H01S 5/065* (2006.01)
  *H01S 5/042* (2006.01)
  *H01S 5/06* (2006.01)
  *H01S 5/062* (2006.01)

(52) U.S. Cl.
  CPC ........ *H01S 5/02476* (2013.01); *H01S 5/0422* (2013.01); *H01S 5/0612* (2013.01); *H01S 5/0622* (2013.01); *H01S 5/0654* (2013.01); *H01S 5/22* (2013.01)

(58) Field of Classification Search
  CPC .... H01S 5/0612; H01S 5/0622; H01S 5/0654; H01S 5/22
  See application file for complete search history.

(56) References Cited

U.S. PATENT DOCUMENTS

| | | |
|---|---|---|
| 2014/0010248 A1 | 1/2014 | Larson |
| 2015/0139256 A1 | 5/2015 | Dallesasse et al. |
| 2016/0211646 A1 | 7/2016 | Avramescu et al. |
| 2017/0104307 A1* | 4/2017 | Lin .................. H01S 5/223 |
| 2017/0194763 A1* | 7/2017 | Treese ............. H01S 5/02453 |
| 2021/0036482 A1* | 2/2021 | Möhrle ............. H01S 5/0612 |

OTHER PUBLICATIONS

Gao, H. et al., Cleaved-coupled nanowire lasers, Proceedings of the National Academy of Sciences of the United States of America, vol. 110, No. 3, Jan. 15, 2013, pp. 865-869.

* cited by examiner

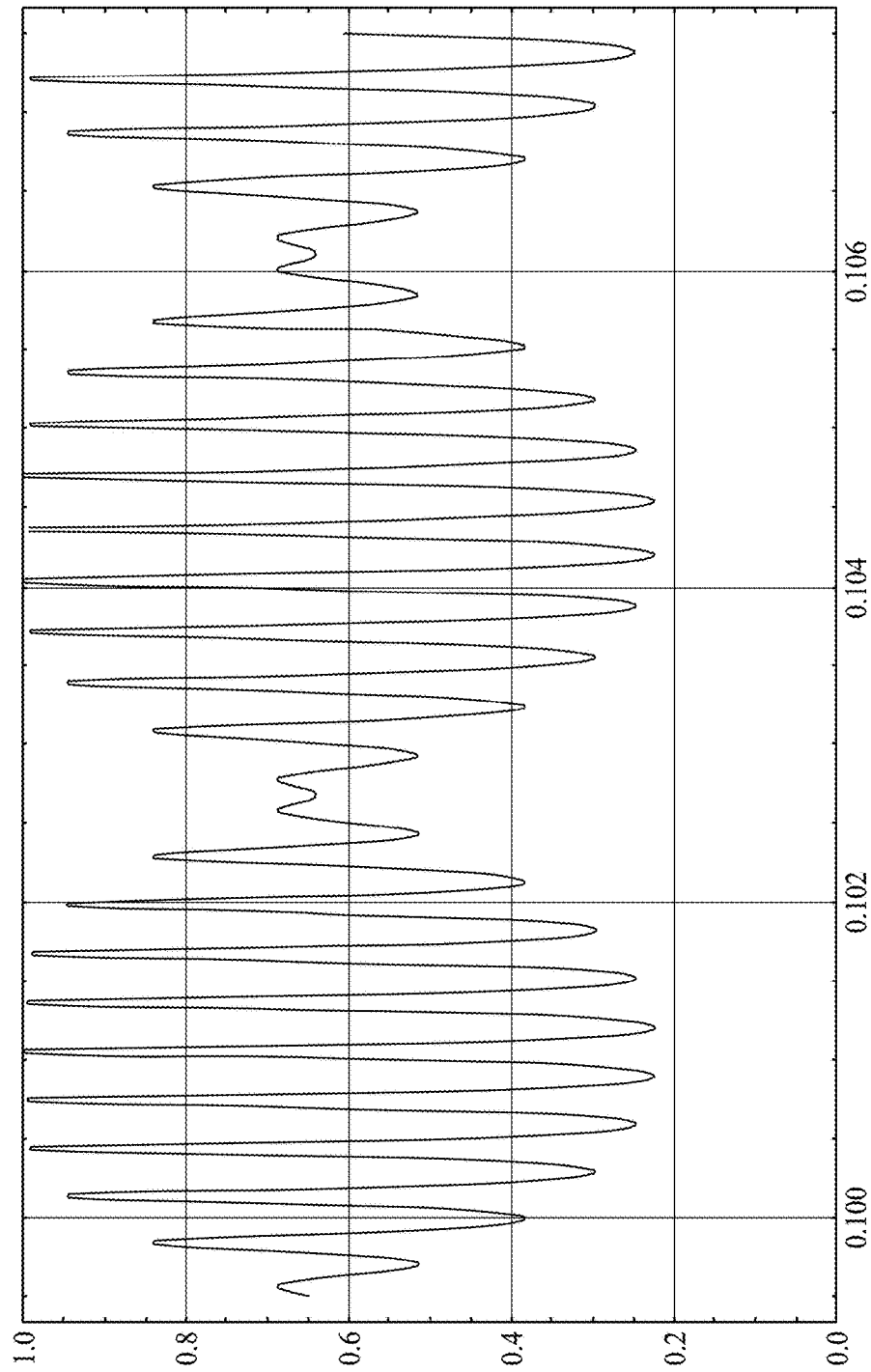

Example transmission of the mirror taking into account the wave-length dependence of the coherent tunneling of the photon induced by the presence of the gap. Wavelength is depicted in arbitrary units. The fats modulation is due to the Fabry-Perot distance of the cavity and the slow modulation due to the Fabry-Perot distance of the gap, i. e. $\frac{2ng}{l_{opt}}$. For illustration purposes we chose an atypically small ratio of optical lengths of gap and cavity. The typical ratio is a factor of 100 to 1000 larger, so over the tuning range of the laser one usually sees only the fast modulation together with a small overall slope induced by the gap.

FIG. 12

A typical spectrum of a coupled cavity laser. The signal to noise ratio of this measurement is about 50 dB, the side mode suppression ratio, indicated by the blue line, is 35.6 dB. Note that the blue line just referred to (i.e., the horizontal line set at 35.6 dB) may appear as a light gray line in a black and white image of this figure.

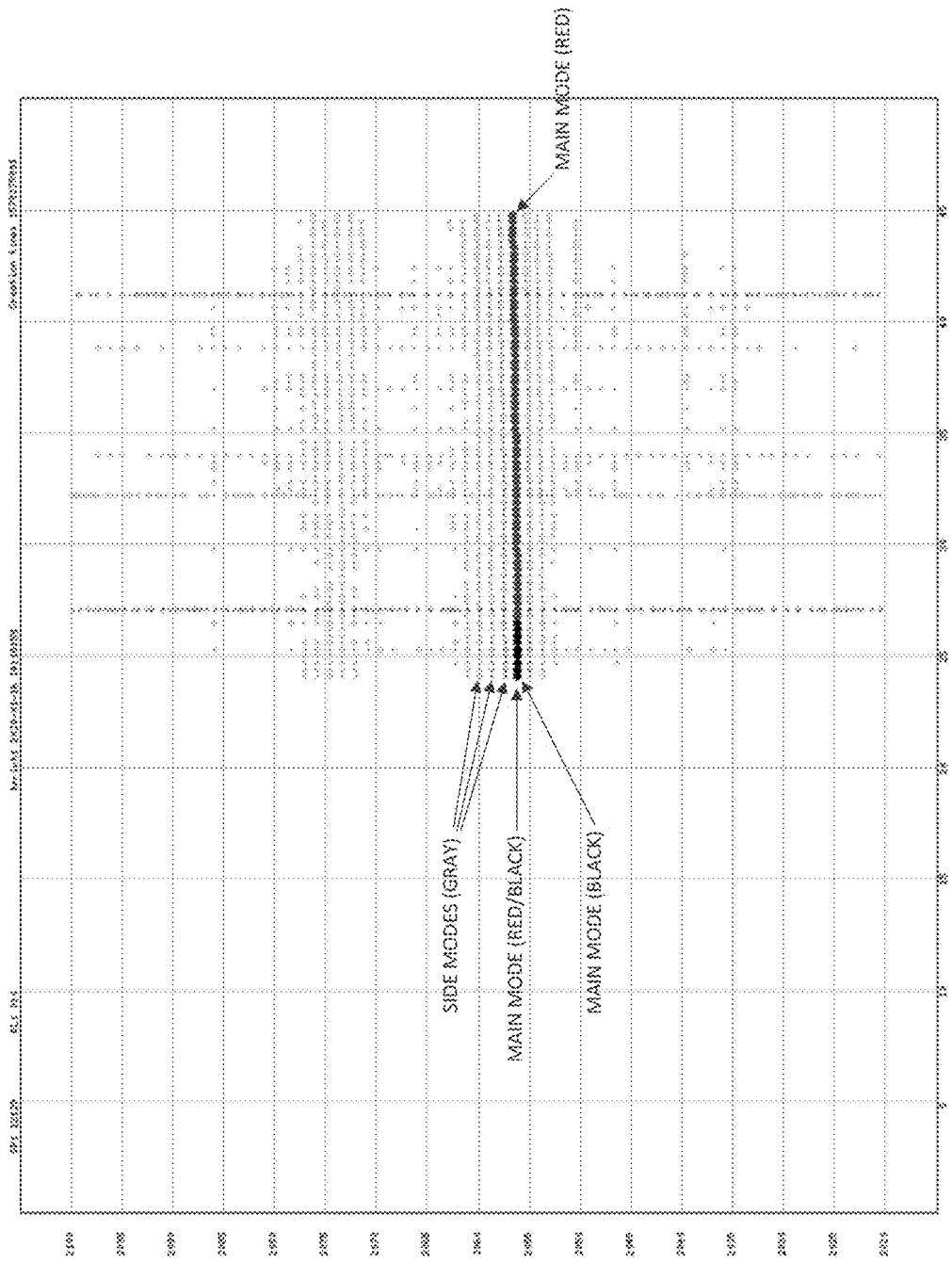

FIG. 14

The side modes of a series of spectra is depicted in grey scale, where the laser current through the short laser segment is varied, while all other operation parameters are held fixed. The main mode is depicted in red if the side mode suppression ratio is larger than 30 dB, otherwise it is depicted in black. Note that the tuning of the main mode (red/black) may appear as medium gray/black in a black and white image of this figure, and tuning of the side modes (gray) may appear as light gray in a black and white image of this figure.

The optical tuning of the main side modes can be clearly seen to be quadratic with the heater current. Moreover, one can clearly see that the gain tunes several times faster than the optical tuning of the side modes.

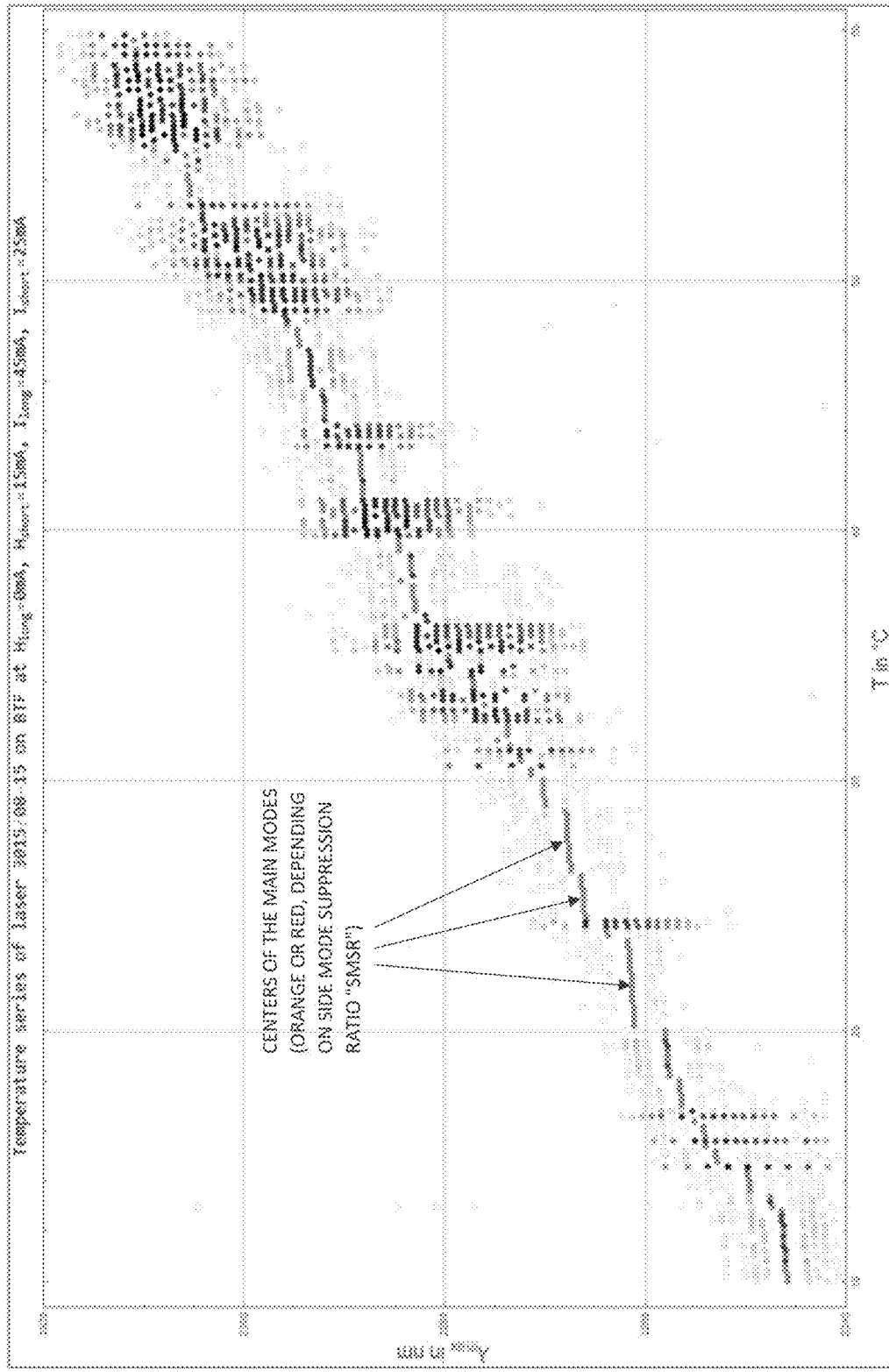

FIG. 16

The optical and the gain tuning can be seen to be linear with the base temperature of the laser chip. One observes that the center of the gain, i.e. the fit to the center of the main modes (orange or red, depending on SMSR) tunes about seven times faster than the optical tuning. This effect is important for widely tunable lasers, because it allows one to adjust the gain and the optical properties of the cavities almost independently. Note that the colors orange or red may appear as medium gray in a black and white image of this figure.

WIDELY TUNABLE, SINGLE MODE EMISSION SEMICONDUCTOR LASER

REFERENCE TO PENDING PRIOR PATENT APPLICATION

This patent application claims benefit of prior U.S. Provisional Patent Application Ser. No. 63/004,816, filed Apr. 3, 1920 by Automotive Coalition For Traffic Safety, Inc. and Tim Koslowski et al. for WIDELY TUNABLE, SINGLE MODE EMISSION SEMICONDUCTOR LASER, which patent application is hereby incorporated herein by reference.

FIELD OF THE INVENTION

This invention relates to lasers in general, and more particularly to widely tunable, single mode emission semiconductor lasers.

BACKGROUND OF THE INVENTION

Single mode emission semiconductor lasers provide light sources for many modern applications, ranging from spectroscopy to telecommunications and far beyond. These single mode emission semiconductor lasers allow for electronic control of the light output and the emitted wavelength $\lambda$.

For many applications, it is desirable to have a wide tuning range of the laser's emitted wavelength across an interval $\lambda_{min} \ldots \lambda_{max}$, whose width is measured by the tuning ratio r, where r is $$r = 2\frac{\lambda_{max} - \lambda_{min}}{\lambda_{max} + \lambda_{min}}. \quad \text{(Eq. 1)}$$

A typical semiconductor laser emits many wavelengths, so additional wavelength selection mechanisms are necessary in order to achieve single mode operation (i.e., the emission of a single wavelength $\lambda$). There exists a wide range of wavelength selection mechanisms, but fully electronic wavelength selection mechanisms are typically limited to a tuning ratio of r≈0.01 or less. Wavelength selection mechanisms that support a wider range of wavelengths typically possess a very large parameter space (i.e., they have a large number of tuning parameters), which complicates the characterization process and the controlled operation of these wavelength selection mechanisms, and thus renders these approaches unfeasible for mass production.

More particularly, semiconductor lasers without a wavelength selection mechanism emit light in many modes (i.e., at many wavelengths). For many applications it is highly desirable to have a laser that emits only a single light mode (i.e., light at only a single wavelength). There exist many wavelength selection mechanisms, but it is often highly desirable to have a monolithic (i.e., on-chip) wavelength selection mechanism. Monolithic (i.e., on-chip) solutions are preferred for several reasons, such as their size and their mechanical stability. Several monolithic wavelength selection mechanisms are known, e.g., distributed feedback (DFB) gratings, distributed Bragg reflector (DBR) structures and Vernier tuning of coupled cavities or resonators, etc.

It is often highly desirable to construct a laser that possesses a wide tuning range for its wavelength. To achieve this, one needs to be able to control the wavelength selection mechanism. For many applications it is highly desirable to have a fully electronic wavelength selection mechanism. These fully electronic wavelength selection mechanisms are typically based on a tuning of the refractive index of the laser's waveguide material using variations of (i) the temperature of the waveguide material, and (ii) the density of the injected current. The best side mode suppression ratios are achieved with lasers having distributed feedback (DFB) gratings and lasers with distributed Bragg reflectors (DBRs). With these wavelength selection mechanisms, it is possible to achieve a tuning ratio of up to 1 percent for typical operating conditions (i.e., r≈0.01).

Wider tuning ranges have been demonstrated where the wavelength selection mechanisms (i.e., the DFB grating or the DBR period) are adjusted not only to select a single wavelength, but also to select two or more preferred wavelengths. It is then possible to build multi-segment lasers such that the absolute tuning of the effective refractive index of the waveguide material (achieved by variations in the temperature of the waveguide material and variations in the density of the injected current) essentially allows for a continuous tuning of the output wavelength, and the relative tuning (e.g., through the selection of phase relations) allows selection of the grating or reflector that is effectively turned on. The combination of these two effects (continuous tuning and relative tuning) achieve, in principle, much higher tuning ranges but, in practice, fabrication and characterization complexities increase significantly as the tuning range increases.

A different approach to wavelength selection uses the Vernier effect. In this approach, one typically defines two cavities, each possessing its own Fabry-Perot wavelength comb. Tuning is then achieved by manipulating the refractive index of the two cavities individually (i.e., using variations of the temperature of the waveguide material and the density of the injected current). This selects an emission wavelength that is contained in both Fabry-Perot wavelength combs and within the range of the gain of the gain material used in the laser. This typically allows for a much wider tuning range than where wavelength selection is based on DFB or DBR wavelength selection mechanisms.

Thus, known monolithic single mode semiconductor lasers with high side mode suppression ratios (i.e., DFB or DBR lasers) possess small tuning ratios of about 1 percent (i.e., r≈0.01). Those lasers that possess DFB gratings or DBRs and which are able to select more than one wavelength are usually very complex in their operation. This makes the operating characteristics of the laser very susceptible to variations in the fabrication process. Finding the desired protocol of operating parameters leads to a very complex characterization process in a high-dimensional parameter space (i.e., it is a highly complex procedure to characterize the particular waveguide material temperature and the particular injected current density for each segment of the laser). This leads to a characterization process that requires the collection of spectra on a fine grid in a high dimensional parameter space. The number of elements of this grid increases exponentially with the number of independent parameters, which makes it unfeasible to fabricate and control DFB or DBR lasers with the number of segments that is necessary to stably select many wavelengths.

Furthermore, known mechanisms that implement wavelength selection through the Vernier tuning principle suffer from a similar problem: since one wants to simultaneously control the output wavelength, output intensity and side mode suppression ratio, one needs many control parameters (in particular, waveguide material temperature and injection current densities). This again leads to a very complex characterization process in a very high dimensional parameter space, which makes mass production of devices with full simultaneous control of output wavelength, output intensity and side mode suppression ratio unfeasible.

SUMMARY OF THE INVENTION

The present invention provides a widely tunable, single mode emission semiconductor laser with fully electronic control of the light intensity and an electronically tunable wavelength with a typical tuning ratio r≈0.1 or more, i.e., more than ten times the tuning ratio of conventional single mode semiconductor lasers. In contrast to known devices with wide tuning ranges, the laser of the present invention possesses a very simple characterization process and an established process route and is thus suitable for mass production.

Generally speaking, the present invention comprises a monolithic semiconductor laser that provides single mode light emission, a wide tuning range for the wavelength, and simultaneous independent control of the light intensity. The semiconductor laser is characterized by a semiconductor material that contains a layer structure suitable for laser emission, with two or more linearly-aligned ridge waveguides structured thereon so as to provide two linearly-aligned coupled cavities. Furthermore, the laser is characterized by (i) the individual controllability of three heating currents, wherein two power resistors are structured in close proximity to the two linear ridge waveguides, and one power resistor is mounted on the base of the chip (i.e., the monolithic semiconductor laser), and (ii) the individual controllability of the laser currents in the two coupled cavities. Furthermore, the laser is characterized by the use of a gain material that possesses wide gain tuning with variations in the temperature of the waveguide material.

More particularly, the present invention is based on the Vernier tuning principle, but the laser is structured in such a way that the characterization process needs very few measured tuning parameters for each laser, while enabling the simultaneous control of wavelength and light output at a high side mode suppression ratio.

The preferred embodiment of the present invention comprises a laser which comprises two linearly-arranged coupled cavities which contain contacts to individually control the two laser currents (i.e., the injection current densities for each coupled cavity). In addition, the laser comprises three heaters: the first two heaters are resistors that are structured on surfaces which are in close proximity to the two coupled cavities, such that each resistor possesses an effective heat contact with only one of the two coupled cavities. The third heater is mounted on the bottom of the laser chip and allows for the control of the temperature of the bulk of the laser chip on a millisecond timescale.

The key observation regarding this design is that the wavelength of a mode is given by a simple relation of the form:

$$\lambda = \lambda_i + aT + b_1 I_1 + b_2 I_2 + c_1 H_1^2 + c_2 H_2^2, \quad (\text{Eq. 2})$$

where a, $b_1$, $b_2$, $c_1$, $c_2$ are the tuning parameters of the coupled cavities that describe the laser tuning with the base temperature T of the chip, the laser currents $I_1$, $I_2$ which are the injected current densities through the two coupled cavities, and the heating currents $H_1$, $H_2$ which are applied to the two coupled cavities through their adjacent heating resistors. The base wavelength $\lambda_i$ depends on the relative refractive index of the two coupled cavities and depends, essentially, on only the effective temperatures of the two coupled cavities. Note that the tuning parameters a, $b_1$, $b_2$, $c_1$, $c_2$ are the same for all base modes $\lambda_i$. The tuning parameters (a, $b_1$, $b_2$, $c_1$, $c_2$) can be measured by measuring spectra around a reference point; both the main mode and the side modes will tune with the tuning parameters (a, $b_1$, $b_2$, $c_1$, $c_2$). The base wavelengths $\lambda_i$ are measured after knowing the tuning parameters (a, $b_1$, $b_2$, $c_1$, $c_2$), by measuring series with a larger step size. The gist is that one needs to measure only a few tuning parameter lines with high precision to find the tuning parameters (a, $b_1$, $b_2$, $c_1$, $c_2$), and identify a fairly coarse grid to find the base wavelengths $\lambda_i$. This drastically reduces the number of operation points that need to be characterized in order to characterize the laser. In this way, one is able to characterize the laser by measuring only five tuning parameters (i.e., a, $b_1$, $b_2$, $c_1$, $c_2$) and a discrete set of base wavelengths $\lambda_i$. The number of base wavelengths depends on the geometry of laser and the particular application of the laser and can be as small as four, but can also reach a number of about 20 base modes for particular purposes. This allows for an effective characterization of the lasers and thus facilitates mass production of the devices.

In connection with the aforementioned Eq. 2, it should be appreciated that:

λ is the target wavelength to which the laser is to be tuned, and is typically measured in nm;

$\lambda_i$ is a specific base wavelength (also sometimes referred to herein as a base mode) which has previously been determined for the laser, with that specific base wavelength $\lambda_i$ being produced by some particular combination of settings for T, $I_1$, $I_2$, $H_1$ and $H_2$ which produces that specific base wavelength $\lambda_i$, and is typically measured in nm;

a is a coefficient typically measured in nm/degrees K;

T is a change in the temperature of the chip from the temperature setting which was used to produce the specific base wavelength $\lambda_i$, and is typically measured in degrees K;

$b_1$, $b_2$, $c_1$ and $c_2$ are coefficients which are typically measured in nm/mA; and $I_1$, $I_2$, $H_1$ and $H_2$ are the changes in the injected currents and the heating currents which were used for the specific base wavelength $\lambda_i$, where $I_1$ and $I_2$ are the injection currents for the first and second coupled cavities, respectively, and where $H_1$ and $H_2$ are the heater currents for the first and second coupled cavities, respectively, all of which are measured in units of mA.

Thus, where a given base mode $\lambda_i$ is known for a particular combination of settings T, $I_1$, $I_2$, $H_1$ and $H_2$, and where the coefficients a, $b_1$, $b_2$, $c_1$ and $c_2$ have been determined for the laser, tuning the laser from a known base mode $\lambda_i$ to a target wavelength λ may be achieved by appropriately adjusting the values of one or more of T, $I_1$, $I_2$, $H_1$ and/or $H_2$ so as to shift the output of the laser from a base wavelength $\lambda_i$ to the target wavelength λ. Of course, it will be appreciated that as one or more of T, $I_1$, $I_2$, $H_1$ and/or $H_2$ is adjusted, the refractive index of one or both of the coupled cavities may change, which may in turn require further changes in the values of T, $I_1$, $I_2$, $H_1$ and/or $H_2$ in order to achieve the target wavelength λ.

It will also be appreciated that many combinations of T, $I_1$, $I_2$, $H_1$ and $H_2$ may be used to produce a given base wavelength $\lambda_i$, and that many different base wavelengths $\lambda_i$ may be identified for a laser of a particular construction. In practice, it is possible to meaningfully characterize the laser by determining five or so base wavelengths $\lambda_i$, or in some cases more base wavelengths $\lambda_i$ (perhaps up to as many as twenty base wavelengths $\lambda_i$ for particular purposes). It will be appreciated that each specific base wavelength $\lambda_i$ is produced by using a particular combination of T, $I_1$, $I_2$, $H_1$ and $H_2$, and the particular combination of T, $I_1$, $I_2$, $H_1$ and $H_2$ which is chosen to produce a base wavelength $\lambda_i$ reflects factors which are relevant to the intended use of the laser.

Thus, in use, where it is desired to tune the laser to some wavelength $\lambda$, and where the laser has already been characterized to identify a plurality of base wavelengths $\lambda_i$, the user selects a base wavelength $\lambda_i$ which is close to the desired wavelength $\lambda$, and sets the laser to that base wavelength $\lambda_i$ by setting the values of T, $I_1$, $I_2$, $H_1$ and $H_2$ to those values which produce the selected base wavelength $\lambda_i$, and then the user adjusts T, $I_1$, $I_2$, $H_1$ and/or $H_2$ as needed in order to move the output of the laser from the selected base wavelength $\lambda_i$ to the desired wavelength $\lambda$.

Two advantages of the present invention over the state of the art are that the present invention provides a widely tunable, single mode emission semiconductor laser that is produced as a monolithic device, and features fully electronic simultaneous control of wavelength and light output at a high side mode suppression ratio. Monolithic devices are preferred as they are small, stable and very robust when mounted in a suitable package. Fully electronic control is highly responsive (i.e., very fast), reliable and controllable with relatively inexpensive, readily-available electronic controls. In particular, wavelength tuning based on the cavity heaters and laser currents can be achieved on a sub-millisecond time scale, while wavelength tuning based on the substrate heater can be achieved on a millisecond time scale.

Another advantage of the present invention over the state of the art is that the laser achieves a wide tuning range while allowing for a rather compact characterization process based on the measurement of only five tuning parameters (i.e., the aforementioned a, $b_1$, $b_2$, $c_1$, $c_2$ in Eq. 2) and a few base wavelengths (i.e., $\lambda_i$ in Eq. 2).

And another advantage of the present invention stems from the utilization of a monolithic fabrication process: the laser can be easily integrated in a photonic integrated circuit which may contain an on-chip wavelength- and side mode-analyzer. The simple characterization process then allows for an online calibration mode.

In one preferred form of the invention, there is provided a widely tunable, single mode emission semiconductor laser comprising:
  a semiconductor substrate;
  a substrate heater for heating the semiconductor substrate;
  first and second linearly-aligned ridge waveguides formed on the semiconductor substrate, the first and second linearly-aligned ridge waveguides being separated by a gap so as to form first and second coupled cavities;
  first and second ridge waveguide heaters for heating the first and second linearly-aligned ridge waveguides, respectively; and
  first and second p-contacts formed on the first and second linearly-aligned ridge waveguides, respectively, and first and second n-contacts in electrical communication with the first and second linearly-aligned ridge waveguides, respectively, for applying first and second laser currents to the first and second linearly-aligned ridge waveguides, respectively.

In another preferred form of the invention, there is provided a method for generating light of a selected wavelength, the method comprising:
  providing a semiconductor laser comprising:
    a semiconductor substrate;
    a substrate heater for heating the semiconductor substrate;
    first and second linearly-aligned ridge waveguides formed on the semiconductor substrate, the first and second linearly-aligned ridge waveguides being separated by a gap so as to form first and second coupled cavities;
    first and second ridge waveguide heaters for heating the first and second linearly-aligned ridge waveguides, respectively; and
    first and second p-contacts formed on the first and second linearly-aligned ridge waveguides, respectively, and first and second n-contacts in electrical communication with the first and second linearly-aligned ridge waveguides, respectively, for applying first and second laser currents to the first and second linearly-aligned ridge waveguides, respectively;
  characterizing the semiconductor laser according to the equation
  $$\lambda = \lambda_i + aT + b_1 I_1 + b_2 I_2 + c_1 H_1^2 + c_2 H_2^2$$
  where a, $b_1$, $b_2$, $c_1$, $c_2$ are the tuning parameters of the first and second coupled cavities that describe the laser tuning with the base temperature T of the semiconductor substrate, the laser currents $I_1$, $I_2$ which are the injected current densities through the first and second coupled cavities, respectively, and the heating currents $H_1$, $H_2$ which are applied to the first and second coupled cavities through the first and second ridge waveguide heaters, respectively; and
  adjusting at least one of T, $I_1$, $I_2$ and $H_1$, $H_2$ as necessary so as to generate light of a selected wavelength.

BRIEF DESCRIPTION OF THE DRAWINGS

These and other objects and features of the present invention will be more fully disclosed or rendered obvious by the following detailed description of the preferred embodiments of the invention, which is to be considered together with the accompanying drawings wherein like numbers refer to like parts, and further wherein:

FIG. 12 is a schematic view showing mirror transmission in a laser;

FIG. 14 is a schematic view showing the side modes of a series of spectra, where the laser current through the short laser segment (i.e., the shorter coupled cavity) is varied, while all other operation parameters are held fixed;

FIG. 16 is a schematic view showing the optical and the gain tuning to be linear with the base temperature of the laser chip.

DETAILED DESCRIPTION OF THE PREFERRED EMBODIMENTS

Figure 1:
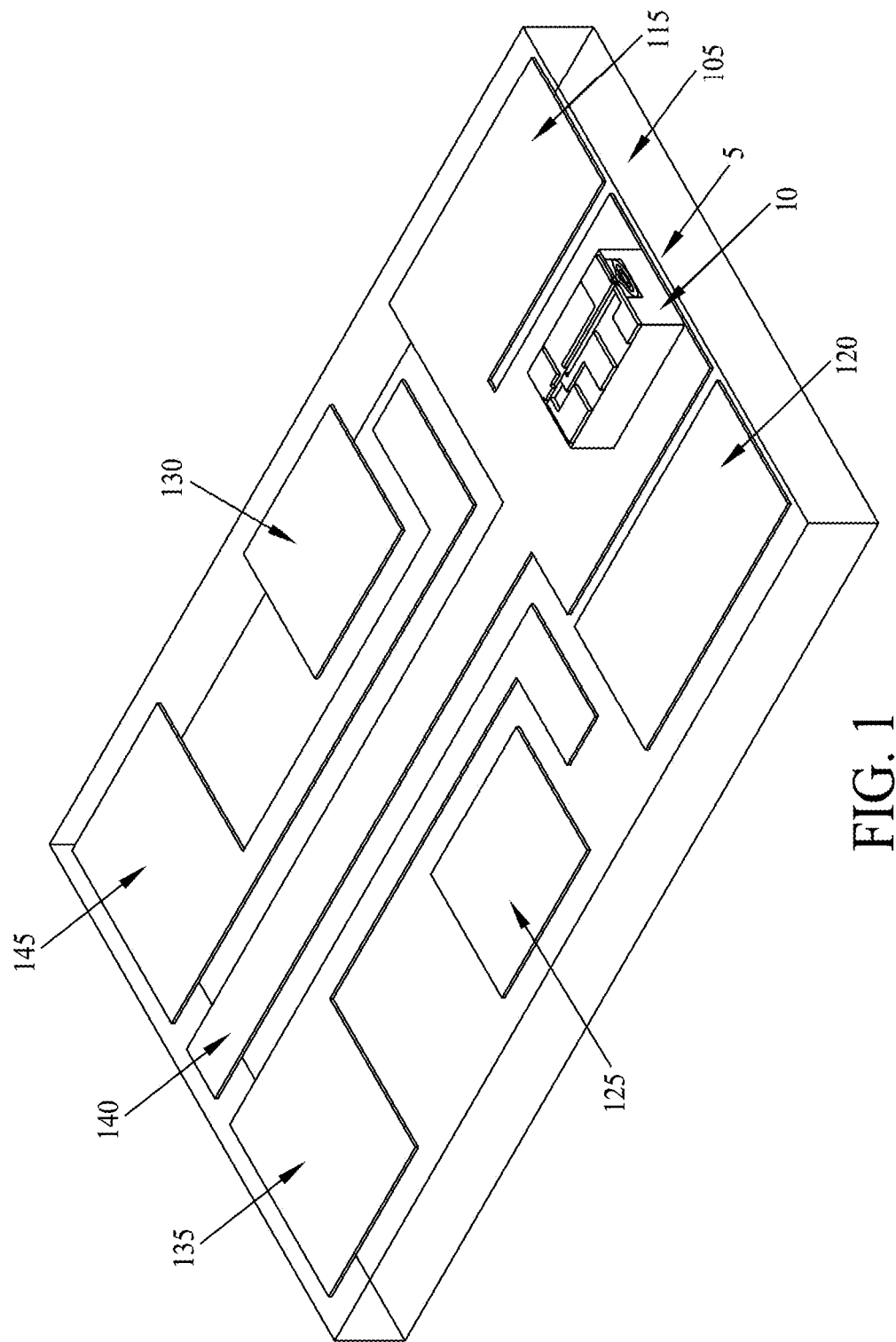
FIGS. 1-6 are schematic views showing a novel semiconductor laser mounted on a heat spreader.
Figure 2:
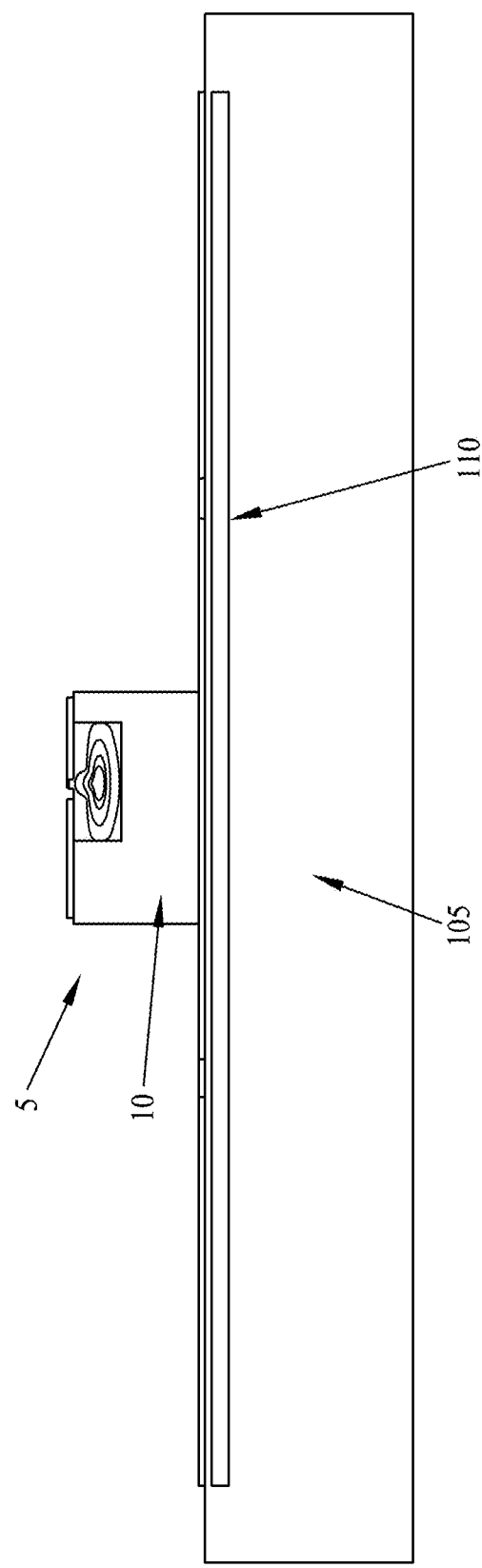
Figure 3:
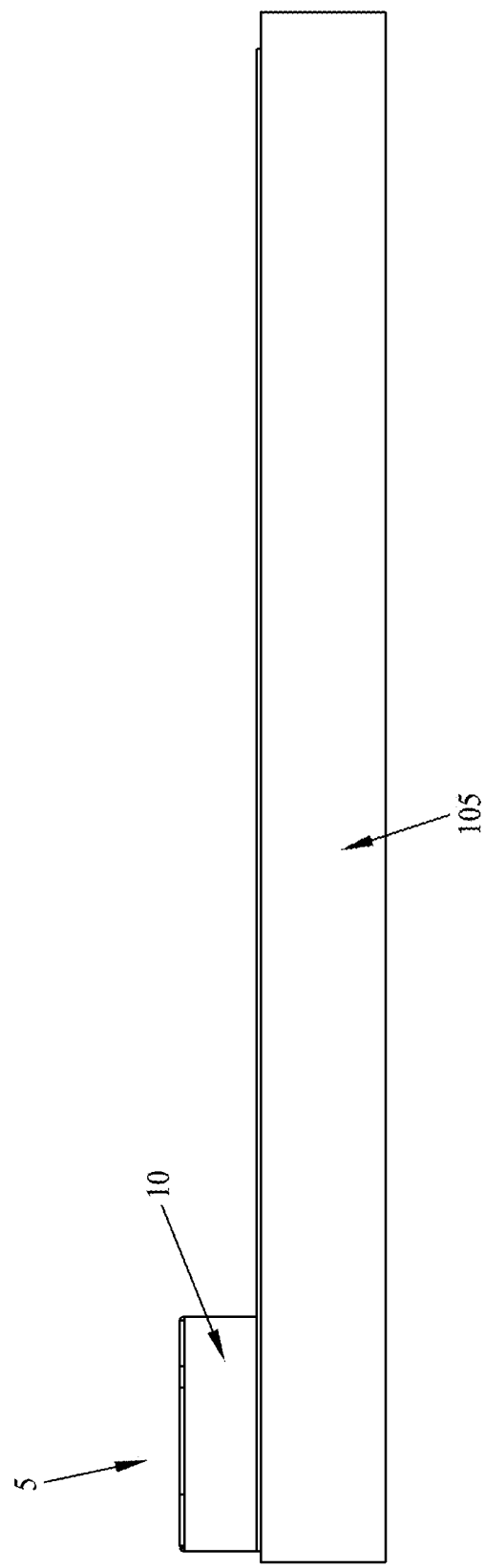
Figure 4:
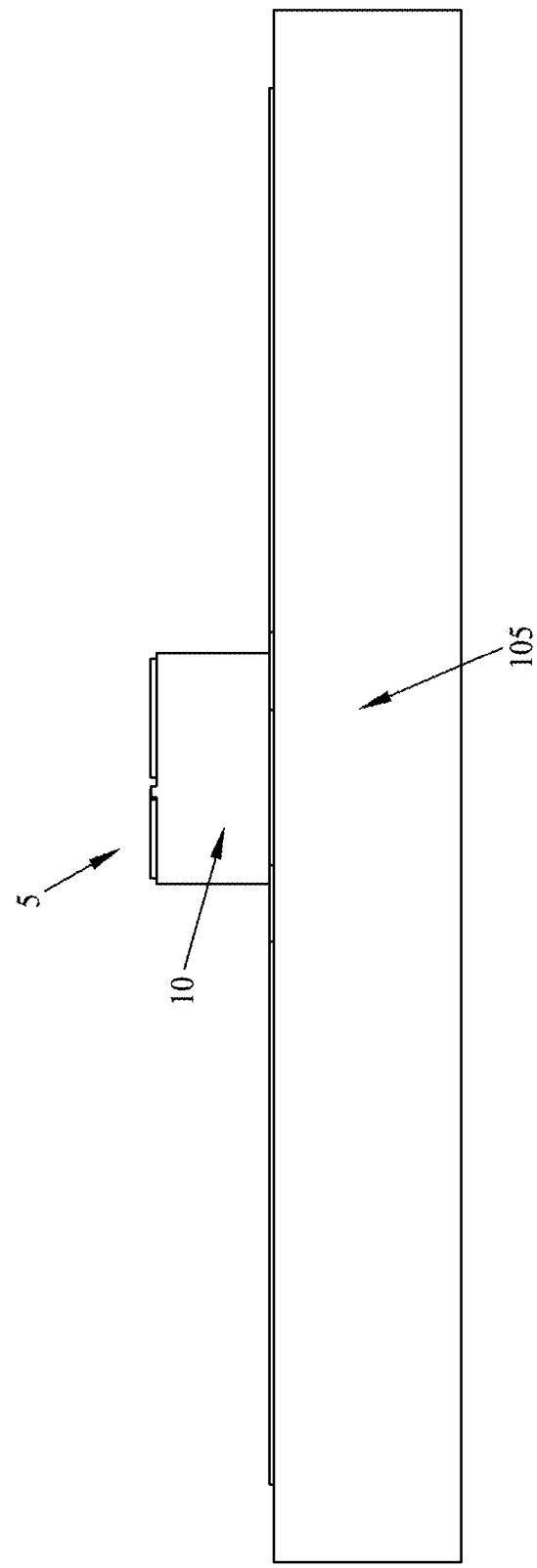
Figure 5:
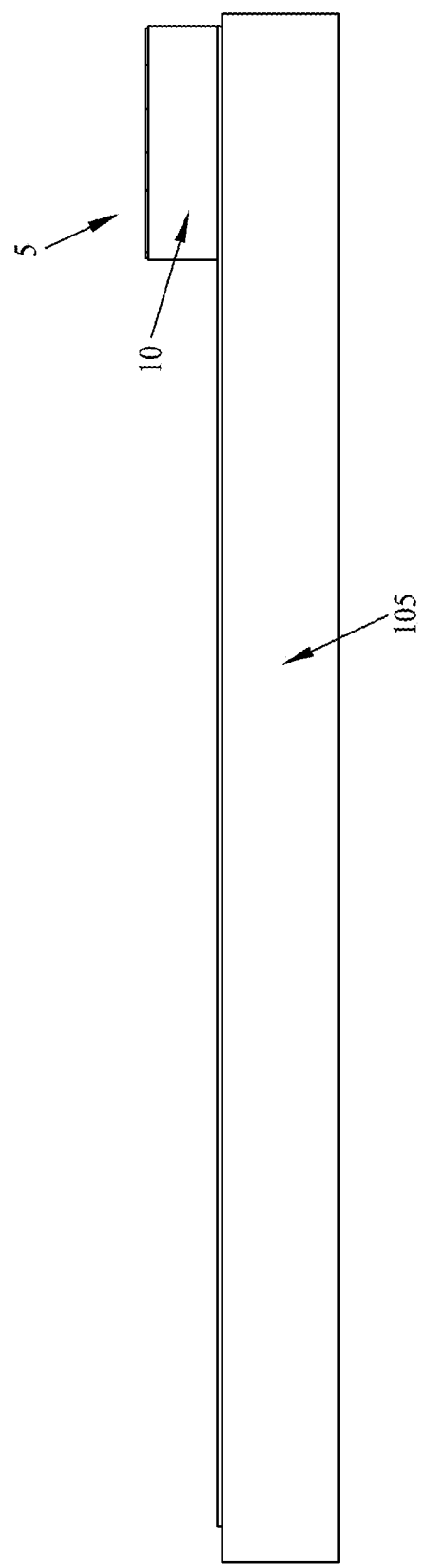
Figure 6:
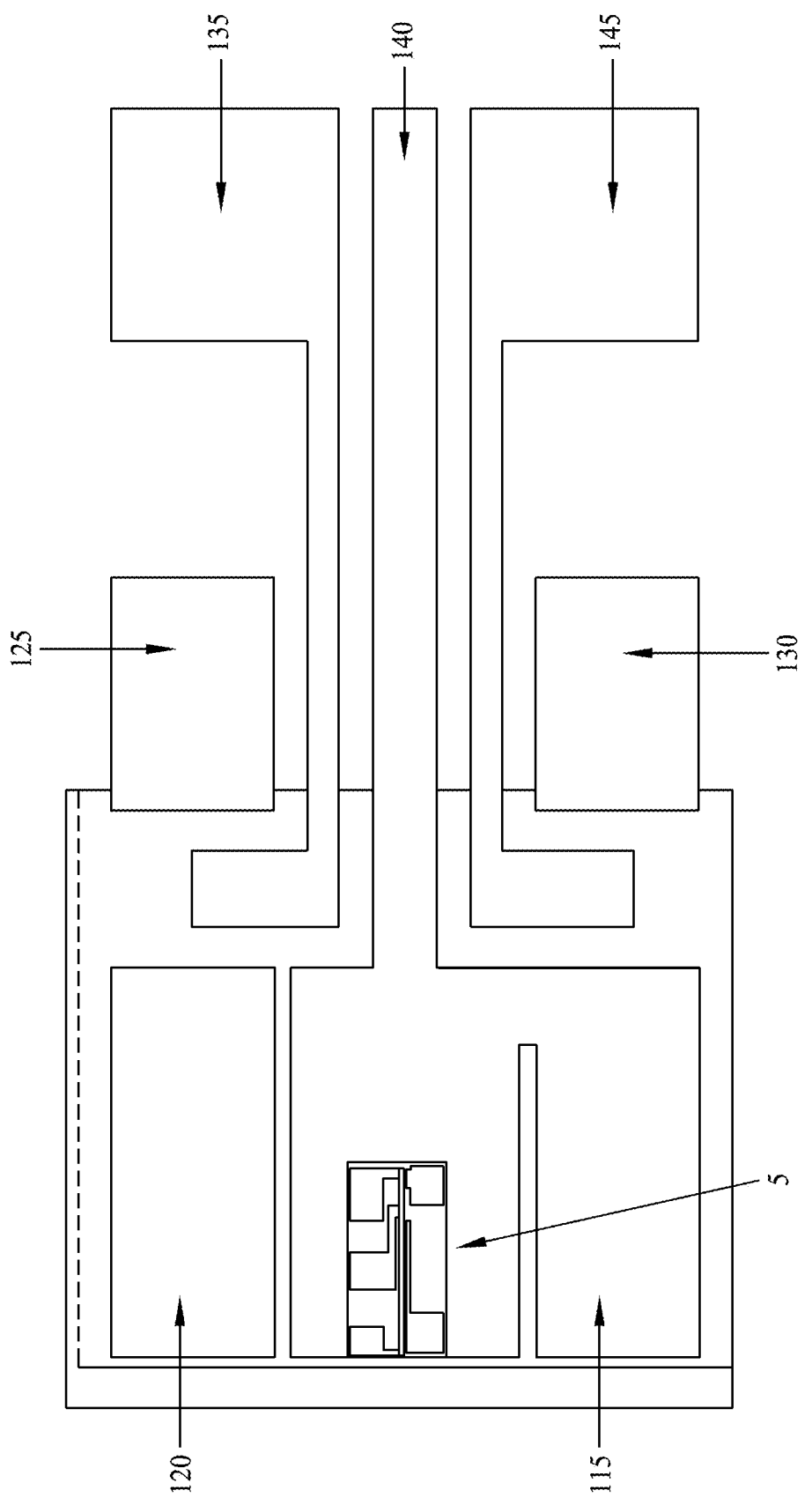
Figure 7:
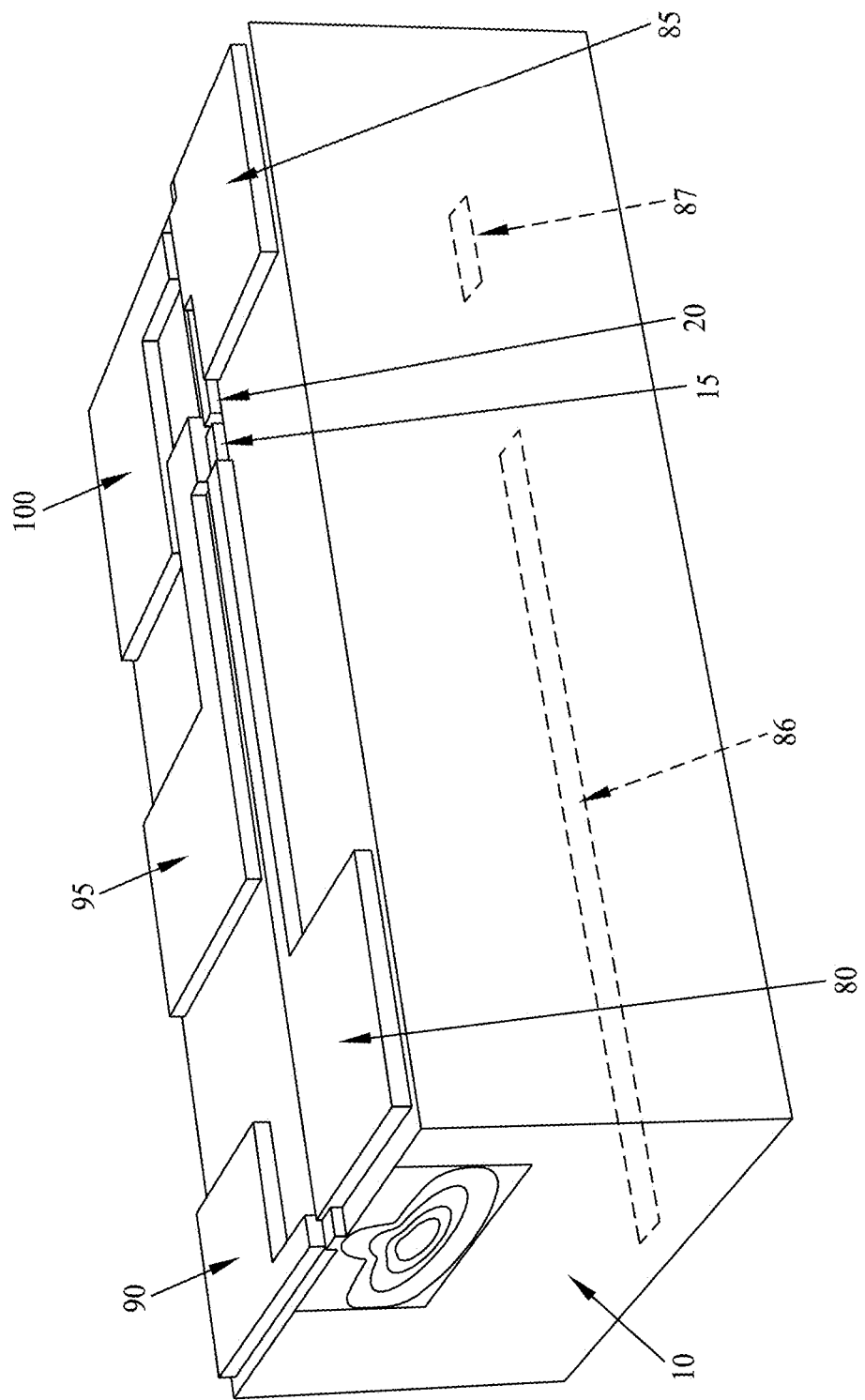
FIGS. 7-10 are schematic views showing further details of the novel semiconductor laser of FIGS. 1-6.
Figure 8:
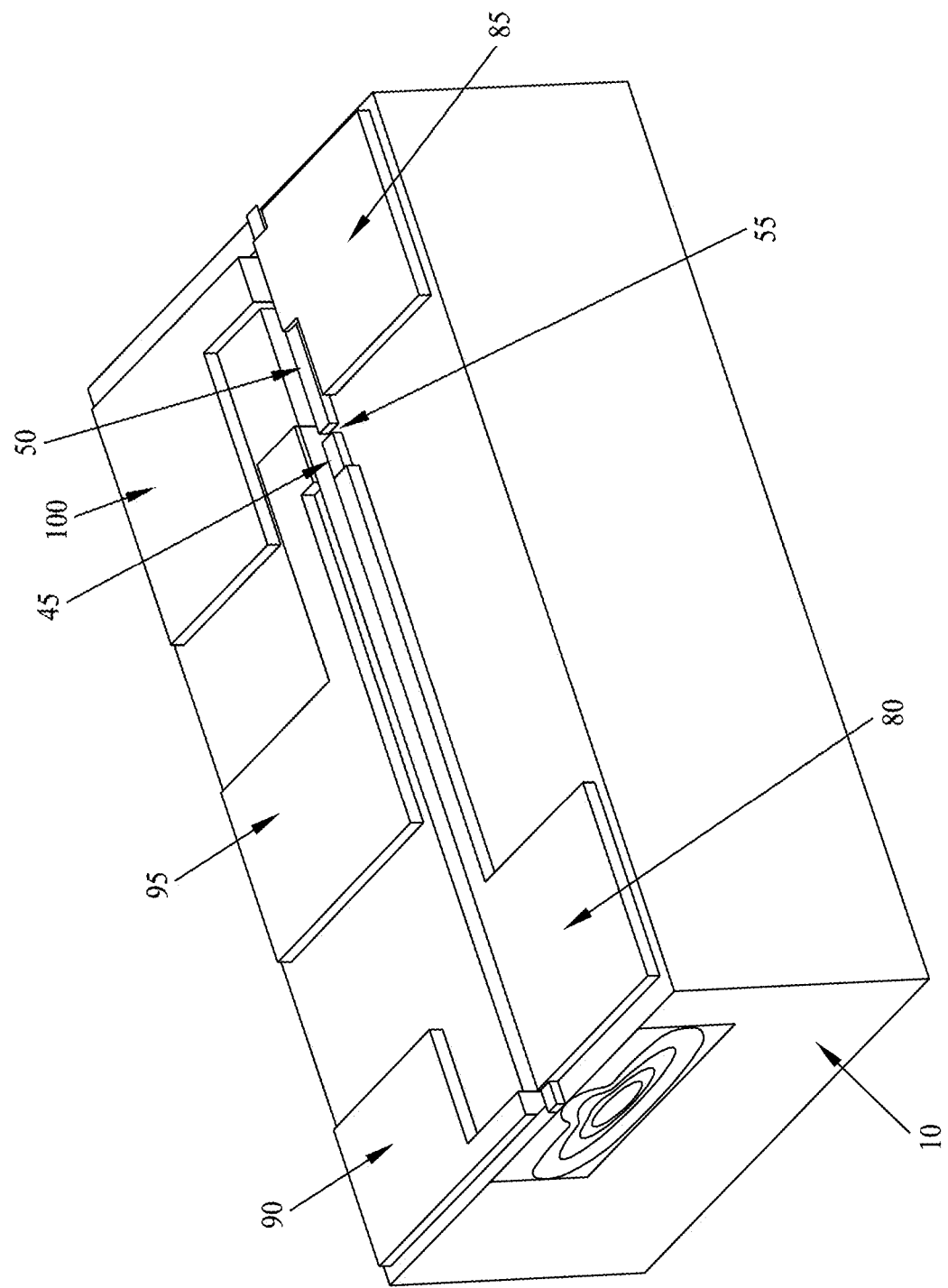
Figure 9:
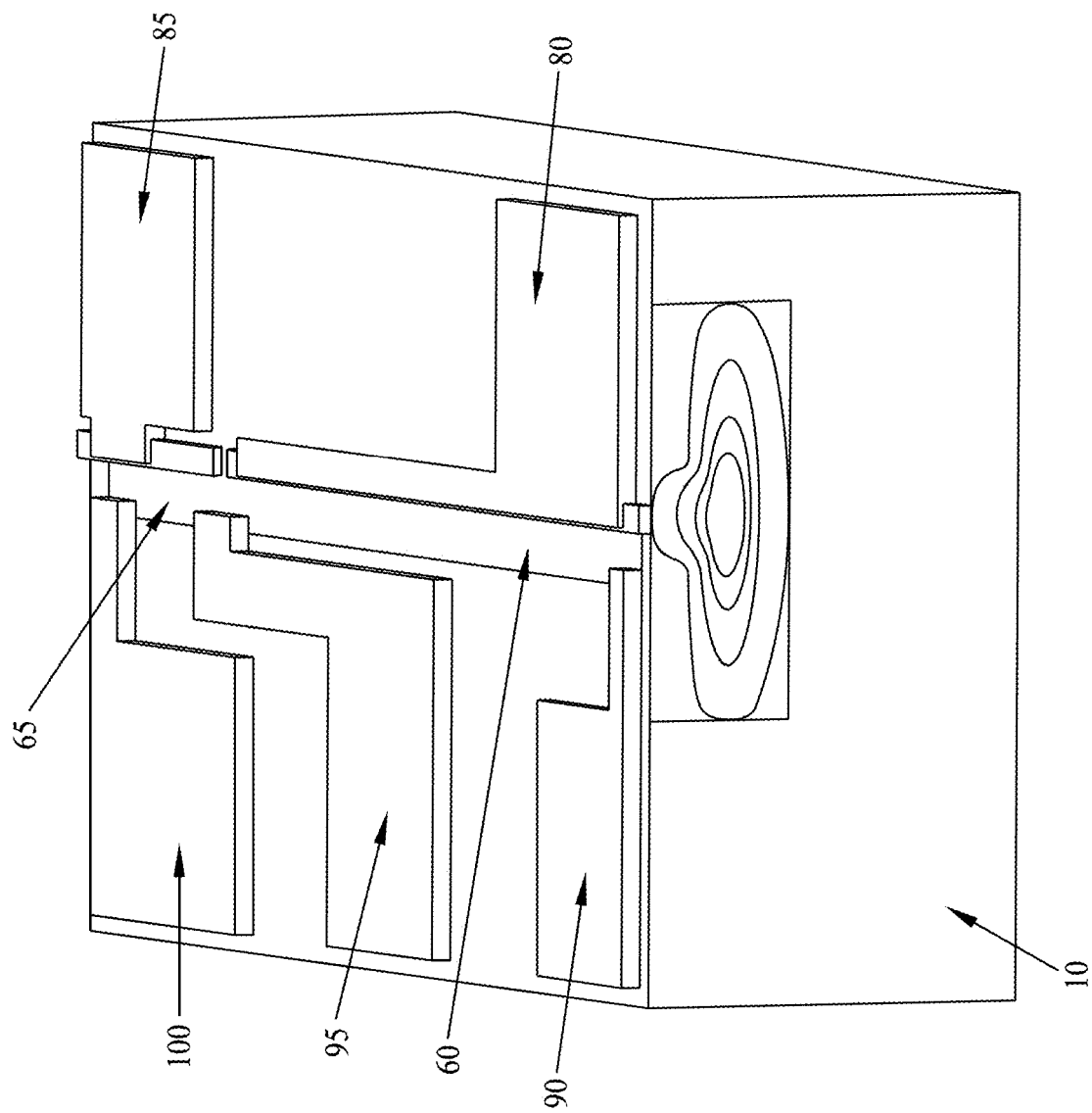
Figure 10:
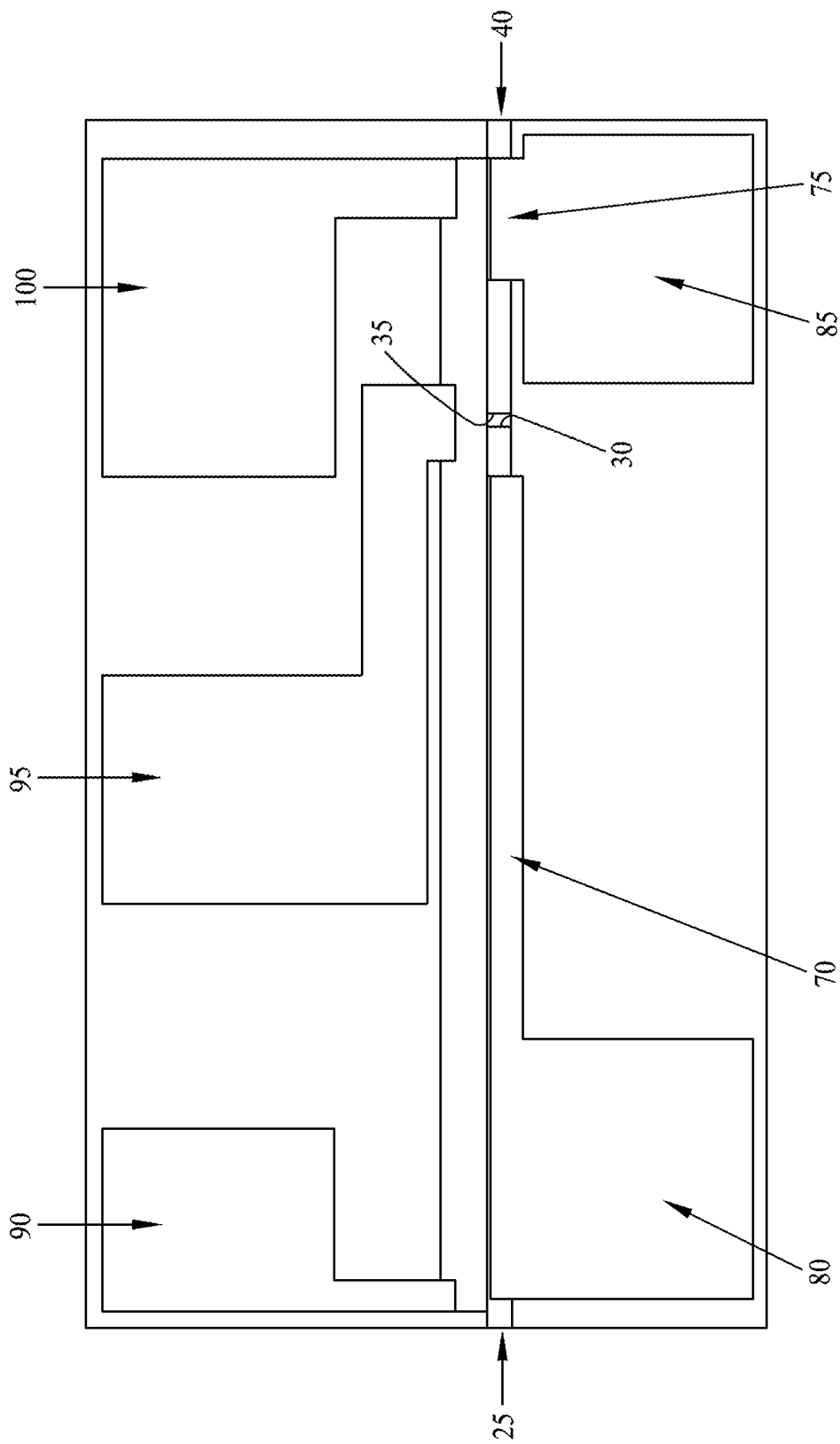

In one preferred form of the invention, and looking now at FIGS. 1-10, there is provided a widely tunable, single mode emission semiconductor laser 5 which comprises a semiconductor substrate 10 with an epitaxy that allows for semiconductor laser operation, e.g., as a laser diode or as a cascade laser. By way of example but not limitation, semiconductor substrate 10 may comprise a III/V semiconductor material such as gallium nitride (GaN), gallium arsenide (GaAs), indium phosphide (InP) or gallium antimonide (GaSb), depending on the target wavelength range of the laser. The epitaxy generally comprises a layer structure that contains an active zone with one or more quantum films, upper and lower cladding, and upper and lower waveguide layers. More particularly, the widely tunable, single mode emission semiconductor laser 5 has a cuboid shape with the bottom formed by semiconductor substrate 10 and the top formed by an upper waveguide layer which is structured so as to provide two linearly-aligned ridge waveguides 15, 20 that are aligned in a straight line perpendicular to the four facets 25, 30, 35, 40, with facets 25, 30 forming the front and rear facets for linear ridge waveguide 15 and facets 35, 40 forming the front and rear facets for linear ridge waveguide 20.

The two linear ridge waveguides 15, 20 preferably have a width and height that are comparable to the target wavelengths, and the two linear ridge waveguides 15, 20 are preferably spaced from one another by a distance D which is about one-half the target wavelength. The two linear ridge waveguides 15, 20 are structured such that they guide the laser mode to the four facets 25, 30, 35, 40. The two linear ridge waveguides 15, 20 define two coupled cavities 45, 50, respectively, with coupled cavity 45 comprising facets 25, 30, and with coupled cavity 50 comprising facets 35, 40. A gap 55 separates the two coupled cavities 45, 50.

The two linear ridge waveguides 15, 20 are preferably generated through a material removal process effected from the top (such as chemical or physical etching). The remaining material (i.e., the material remaining after etching) then defines the two linear ridge waveguides 15, 20. The lengths of the coupled cavities 45, 50 are typically defined through a second material removal process, typically etching, such that facets 25, 30, 35, 40, as well as the gap 55 between the two linear ridge waveguides 15, 20, are defined with a precision on the order of 10 nanometers. The typical length of the two coupled cavities 45, 50 is between from about 80 nm to about 800 nm. It is also possible to structure Distributed Bragg Reflectors (DBRs) on facets 25, 30, 35, 40 to control the reflectivity of the facets and gap 55 beyond the values that are obtainable with a single etching step.

Figure 11:
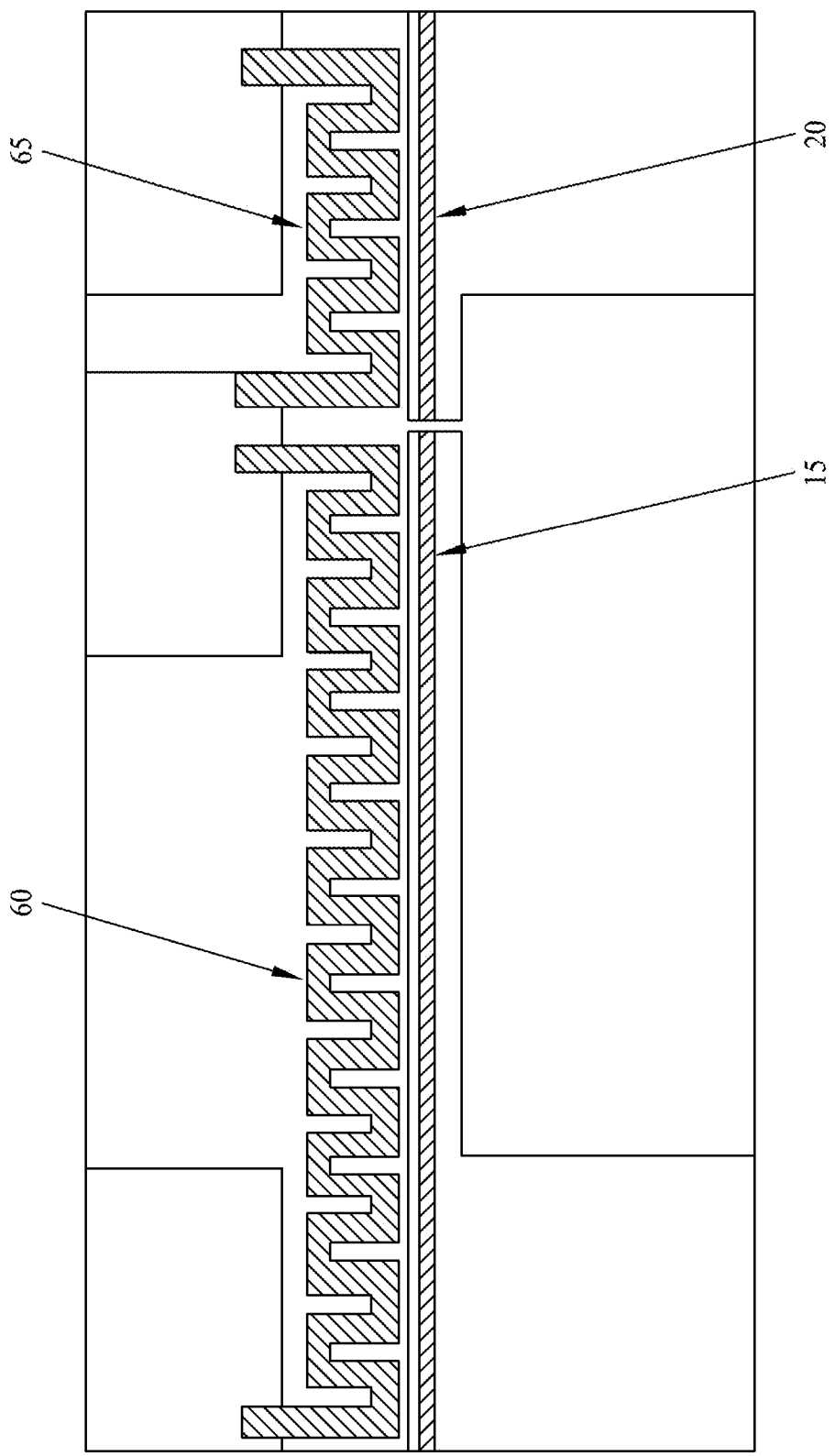
FIG. 11 is a schematic view showing the "meandering" structure of the two heating resistors used to heat the two coupled cavities of the novel semiconductor laser.

Two heating resistors 60, 65 are structured in close proximity to the sides of the two linear ridge waveguides 15, 20, i.e., heating resistor 60 extends along linear ridge waveguide 15 and heating resistor 65 extends along linear ridge waveguide 20. The distance is typically one or a few micrometers (note: this refers to the lateral distance between the linear ridge waveguides 15, 20 and the heating resistors 60, 65, respectively—ideally one would like these to be as close as possible, but the minimum distance is limited by the fact that one needs to isolate the heating resistors 60, 65 from the laser contacts (i.e., p-contacts 70, 75, respectively, see below), therefore a distance of a few, e.g., two, micrometers, is necessary). The two heating resistors 60, 65 are typically processed from a highly conducting material (e.g., titanium (Ti), platinum (Pt), or gold (Au)) and their dimensions are arranged such that the total resistance is on the order of a few Ohms. It is particularly preferred that the heating resistors 60, 65 possess a "meandering" structure, which enhances the heat contact between the two linear ridge waveguides 15, 20 and the two heating resistors 60, 65, respectively, at constant resistivity (see, for example, FIG. 11, which schematically illustrates the aforementioned "meandering" structure).

The laser 5 comprises two p-contacts 70, 75 for receiving the laser currents on the tops of the two linear ridge waveguides 15, 20, i.e., p-contact 70 extends along linear ridge waveguide 15 and p-contact 75 extends along linear ridge waveguide 20. The two p-contacts 70, 75 are typically processed with a highly conductive material, e.g., gold (Au), and linked to two laser current contact pads 80, 85, respectively (i.e., contact pad 80 is connected to the p-contact 70 for linear ridge waveguide 15 and contact pad 85 is connected to the p-contact 75 for linear ridge waveguide 20). The two laser current contact pads 80, 85 are positioned on the opposite side of laser 5 to the two heating resistors 60, 65. The two n-contacts 86, 87 for the two coupled cavities 45, 50 are processed on the bottom of the chip (i.e., at the bottom of semiconductor substrate 10, see FIG. 7) in a manner which will be appreciated by those skilled in the art in view of the present disclosure. By way of example but not limitation, in one preferred form of the invention, the two n-contacts are a single, shared n-contact—it is simply the bottom of the chip that is soldered onto the heat spreader (see heat spreader 105, below, with its integrated heating resistor 110, also below). The individual currents are injected through the p-contacts 70, 75 and do not widen before passing through the active layer (i.e., the gain media in linear ridge waveguides 15, 20) due to dimensions and relatively low lateral conductivity.

The two heating resistors 60, 65 are provided with their own contact pads, preferably on the side opposite to the laser current contact pads 80, 85, and the two heating resistors 60, 65 may share a common ground contact pad. By way of example but not limitation, three heating resistor contact pads 90, 95, 100 may be provided, with contact pad 95 being a common ground contact pad, so that contact pads 90, 95 are used to supply current to heating resistor 60, and contact pads 100, 95 are used to supply current to heating resistor 65.

The semiconductor substrate 10 of the laser 5 is preferably mounted on a heat spreader plate 105 that contains a heating resistor 110 for heating the bulk of semiconductor substrate 10. Contact pads 115, 120 are used to supply electrical current to heating resistor 110.

If desired, contact pads 125, 130, 135, 140, 145 may be provided on heat spreader 105, with the contact pads providing easy electrical connection to various components of semiconductor laser 5, e.g., various ones of contact pads 125, 130, 135, 140, 145 may be connected to various ones of contact pad 80 for p-contact 70 of coupled cavity 45, contact pad 85 for p-contact 75 of coupled cavity 50, contact pad 90 for heating resistor 60, contact pad 95 (the common ground) for heating resistors 60, 65, and contact pad 100 for heating resistor 65, whereby to provide easy electrical connection to these components. Note that the various contact pads do not require a particular bonding scheme, and may be adjusted according to a particular application. However, it is generally preferred that the common ground for the heating resistors 60, 65 is bonded to the ground for the chip heating resistor 110. In other words, it is generally preferred that contact pad 120 (the ground) of chip heating resistor 110 is connected to contact pad 140 for the common ground 95 for heating resistors 60, 65.

Thus it will be seen that, in the preferred embodiment of the present invention, there is provided a semiconductor laser 5 which comprises a semiconductor substrate 10, a first linear ridge waveguide 15 which forms a first coupled cavity 45, and a second linear ridge waveguide 20 which forms a second coupled cavity 50, with first coupled cavity 45 being separated from second coupled cavity 50 by a gap 55. Coupled cavities 45, 50 comprise p-contacts 70, 75 and n-contacts (not shown, and preferably in the form of a common n-contact) for allowing laser currents $I_1$, $I_2$ to be injected into coupled cavities 45, 50, respectively. Coupled cavities 45, 50 also comprise heating resistors 60, 65, respectively, for heating the coupled cavities when heating currents $H_1$, $H_2$ are applied to heating resistors 60, 65, respectively. A heating resistor 110 is provided for heating the semiconductor substrate 10 of laser 5 so as to regulate the base temperature T of the chip (i.e., semiconductor substrate 10).

The foregoing construction provides semiconductor laser 5 with five "controls" which may be used to regulate the output wavelength of laser 5, i.e., the base temperature T of the chip (which is controlled by current passed through heating resistor 110), the laser currents $I_1$, $I_2$ which are injected through the two coupled cavities 45, 50 (i.e., by means of the p-contacts and n-contacts for the two coupled cavities), and the heating currents $H_1$, $H_2$ which are applied to the two coupled cavities through the adjacent heating resistors 60, 65.

In essence, in the preferred embodiment of the present invention, semiconductor laser 5 comprises two coupled cavities 45, 50 which are heated by heating resistors 60, 65, respectively. One of the coupled cavities 45, 50 possesses a length that ensures that the distance between two of its Fabry-Perot modes is smaller than the tuning range. This is typically the shorter cavity (i.e., cavity 50 in the construction shown in FIGS. 1-10). The longer cavity (i.e., cavity 45 in the construction shown in FIGS. 1-10) may be several times longer than the shorter cavity 50. The two heating resistors 60, 65 are preferred to have a resistance on the order of 1-20 Ohms. This ensures that the cavities can be heated at voltages less than 10 Volts and at currents less than 500 Milliampere. Semiconductor laser 5 is constructed on a semiconductor substrate 10 which has its own heater 110.

In the preferred form of the invention, the semiconductor laser 5 is disposed (e.g., soldered) on a heat spreader 105.

The preferred mode of operation of the laser is to characterize the laser according to Eq. 2. Each shape of the base mode possesses a distinct base wavelength $\lambda_i$. Then a combination of the heater currents $H_1$, $H_2$ can be tuned to sweep a range of the wavelengths. Thereafter, the base temperature T of the laser is adjusted by changing the current of the heater which heats the semiconductor substrate (i.e., the chip). This shifts the gain maximum. The laser currents $I_1$, $I_2$ are then adjusted to achieve the desired light output level; this is necessary since the laser efficiency depends critically on the base temperature T of the chip (i.e., semiconductor substrate 10). The ratio between the two laser currents $I_1$, $I_2$ is then adjusted to achieve an optimal side mode suppression ratio.

Then another sweep may be performed, e.g., by varying the combination of heater currents $H_1$, $H_2$. This process may be repeated until the entire gain of the laser material is covered. The advantage of fixing the base temperature T and then performing another sweep is that this tuning process is very fast, since the slowest part in tuning is achieving a change in the base temperature T of the chip (i.e., semiconductor substrate 10).

Additional Information on the Characterization of the Semiconductor Laser

1. Background

There exists a plethora of possibilities for the construction of widely tunable semiconductor lasers that are able to achieve stable single mode operation over a wide range of wavelengths. The requirement that these lasers are suitable for series production sets imposes a number of constraints, in particular:

1. Established process: There has to be an established process route that allows for high reproducibility and minimal process variation.
2. Monolithic device: It is highly advantageous to produce a monolithic device in which the laser consists of one singe semiconductor chip. This avoids costly and fragile alignment steps during production.
3. Fully electronic control: It is highly desirable for field applications that the tuning is achieved through purely electronic control, which allows for applications with relatively low cost control electronics.
4. Simple characterization: Widely tunable lasers possess high dimensional parameter spaces (base temperature and various laser and further control currents). The direct characterization of a high dimensional parameter space is unfeasible; e.g., a five dimensional parameter space scanned at a resolution of one percent in each parameter requires characterization of the laser at 10 billion operation points. It is therefore essential for series production that one has an effective model of the laser at ones disposal which is described by only a few parameters and that these parameters can be measured easily and with sufficient precision.

2. Effective Model

Inspection of the equilibrium states reveals that in a given laser they depend only on a small set of specific combinations of certain macroscopically accessible quantities. These quantities are the center $k_o$ and width $\Delta k$ of the gain of the laser material, as well as the effective refractive indices $n_i$ of the cavity segments. These quantities are in turn functions that depend essentially only on the base temperature T of the laser chip as well as the laser $I_i$ and heater $H_i$ current levels of the laser segments, i.e., $$k_o(T, I_1, \ldots, I_n) \text{ and } n_i(T, I_1, \ldots, I_n),$$

while $\Delta k$ is practically constant. A sufficiently good model for the gain maximum is $$k_o = k_o^o + a_o T + \sum_i \left( b_o^i I_i + c_i (H_o^i)^2 \right), \qquad (1)$$

while it is practically sufficient to assume that the gain width $\Delta k$ remains constant. The effective refractive indices of the laser segments can be described by $$n_i = n_i^o + a_i T + b_i I_i + c_i H_i^2, \qquad (2)$$

while the effective refractive index of the gap is described by $$n_g = n_g^o + a_o T + \sum_i \left( b_g^i I_i + c_i (H_g^i)^2 \right). \qquad (3)$$

Figure 13:
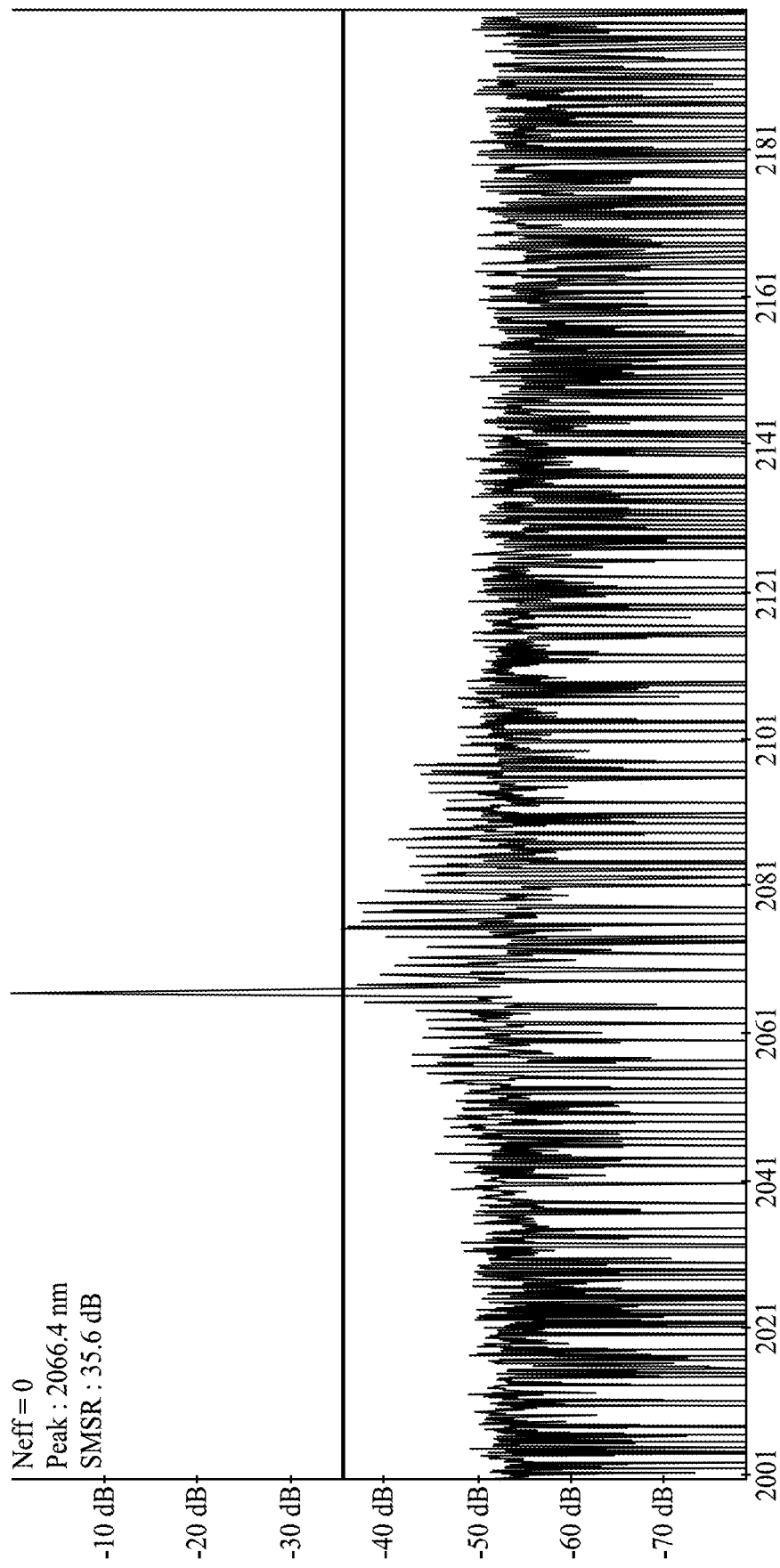
FIG. 13 is a schematic view showing a typical spectrum of a coupled cavity laser.

The effective model of the laser then consists of investigating which light modes, labelled by their vacuum wave number $$k = \frac{2\pi}{\lambda}$$

of the laser minimize the mirror losses, while lying within $$\pm \frac{\Delta \kappa}{2}$$

from the gain maximum $k_o$. The modes that minimize the mirror losses are the so-called Fabry-Perot modes. These are standing waves whose modulus of the electric field possess minima at both laser facets. These modes are exponentially amplified through stimulated emission in the gain material with an effective exponent that is given by the average number of gain length lg that a single photon in the mode is reflected between the cavities. See FIG. 12. It is important for the calculation of the laser spectra to take into account that the combination of gap and one of the laser segments can be viewed as an optical element that facilitates coherent tunneling through one of the laser facets. This coherent tunneling possesses a periodic dependence on the vacuum wave number of the mode, and thus is wavelength dependent. FIG. 13 shows schematically the transmission of the right facet for a right moving mode. An analogous picture exists for the left moving mode on the left facet. It is a particular advantage of the present design that these two reflectivities are the same for the left-moving and right-moving components of the Fabry-Perot modes, due to the periodicity of the Fourier transform. This reduces the amount of characterization necessary to understand the Vernier points of the laser. The product of the reflectivities of the two facets allows one to calculate the effective number of gain lengths that a photon remains in the laser, which in turn is the amplification exponent of the mode. Only the modes with the largest amplification exponents will appear within the spectrum of the laser. This connects the model parameters with spectra of the laser at an operation point. It is important to notice that one possesses an analytic expression for the wavelength dependence of the reflectivities of the two facets and that the reflectivity of each facet is well approximated by a periodic function of the wave number.

3. Characterization

The identification of the modes with the highest reflectivities as the modes that appear in the spectra of the laser allows one to characterize the laser effectively by measuring a few spectra. It is fairly simple to identify the tuning of the entire cavity by considering the side mode spectrum of a laser. The Fabry-Perot modes of the entire laser appear as side modes of the coupled cavity laser. The vacuum wave number of the Fabry Perot modes is $$k_n = 2\frac{n(\lambda)}{\lambda}. \quad (4)$$

These modes are seen as the main and side modes (modes with signal above −50 dB) in FIG. 13. Using $n(k)=n(k_o)=dm/dk(k_o)(k-k_o)$, one sees that the distance between side modes is given by twice the length of the laser divided by the group index. One can easily measure the tuning parameters by measuring series in which one varies one of the laser parameters at a time. The tuning of the main mode (red/black) and the side modes (grey scale) is shown in FIG. 14 as the laser current of the short laser segment (i.e., linear ridge waveguide 20) is varied from 23 mA to 45 mA, while the other control parameters are held fixed. The slope of this curve determines the tuning coefficient $b_2$ for the current $I_2$ in Eq. 2 (in the example of FIG. 14, the tuning coefficient $b_2$ possesses a slope of the main mode and of the side modes of about 0.11 nm/mA). This slope represents the tuning parameter of the entire optical length through current tuning. An analogous tuning can be measured when varying the laser current through the long laser segment (i.e., linear ridge waveguide 15), thus measuring the tuning parameter $b_1$ (for the current $I_1$ in Eq. 2) of the long laser segment. Another important piece of information that can be read directly from FIGS. 13 and 14: the intensity of the side modes within the gain region exhibits a periodic modulation. This period is about 17 nm in FIG. 14 and it can be observed that the tuning of the side modes is slower than the tuning of the main modes. This is the resonant transmission effect of the optical length of the short cavity (i.e., linear ridge waveguide 20). The main mode is seen to be the mode that lies at the maximum of the periodic reflectivity function of the short cavity (i.e., linear ridge waveguide 20), whose maximum crosses the main mode at around 41 mA. This is a Vernier point, i.e., a point where the combined reflectivities of both mirrors achieve a maximum. Using the periodicity of the reflectivity and the tuning parameters, we can now predict a large number of Vernier points.

Figure 15:
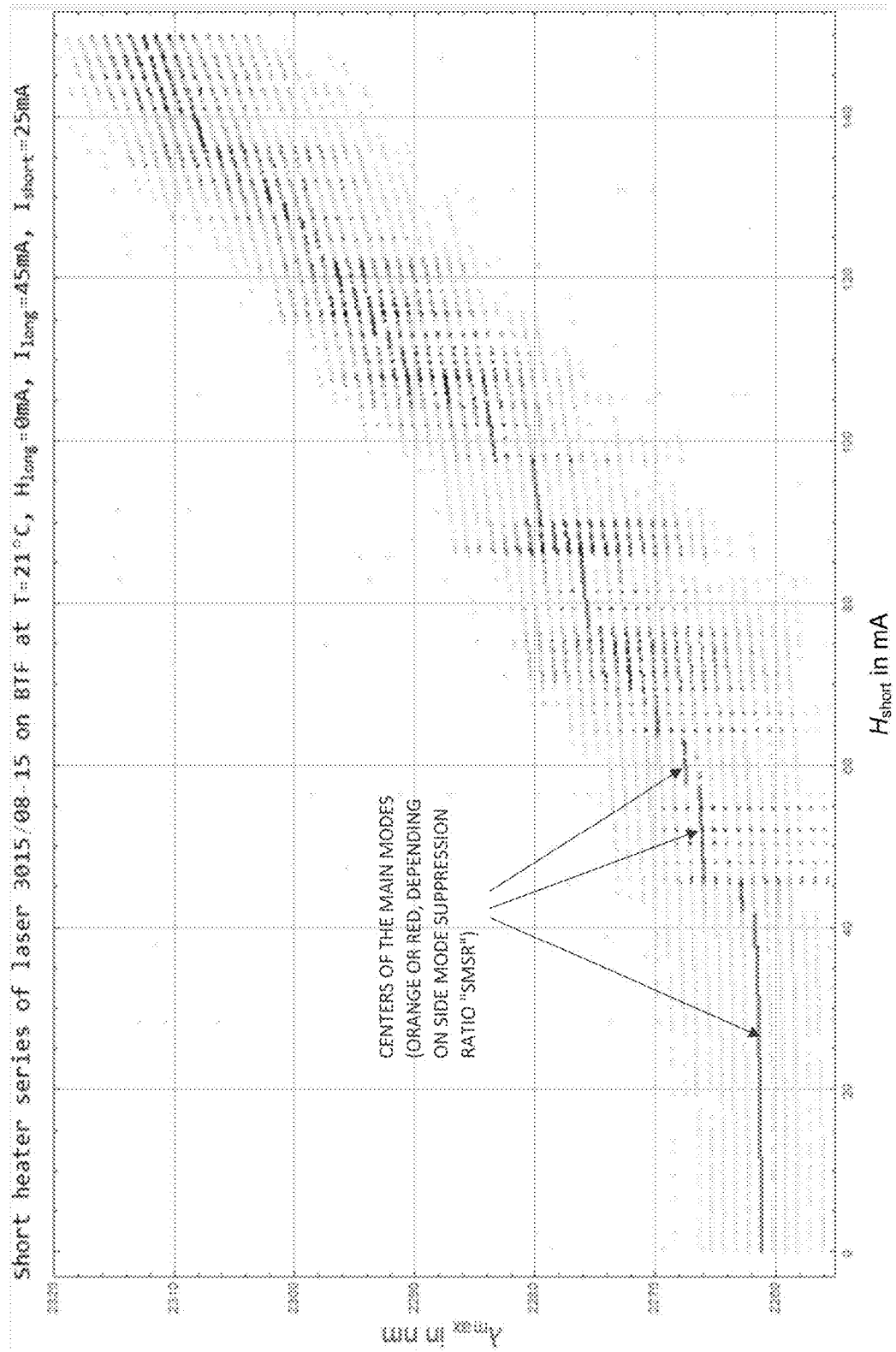
FIG. 15 is a schematic view showing the optical tuning of the main side modes with the heater current of the short laser segment (i.e., the shorter coupled cavity)

The measurement of the tuning of the heater currents $H_1$ and $H_2$ for the linear ridge waveguides 15 and 20, respectively, is analogous to the measurement of the laser currents $I_1$ and $I_2$. FIG. 15 depicts the tuning of the laser with variations in the heater current of the shorter linear ridge waveguide 20, with only the main side modes drawn. It can be clearly seen that the tuning is quadratic with the heater current, as one expects, since the heat produced by a heater scales quadratically with the current applied to the heater and the tuning scales linearly with the temperature change produced by the deposited heat. This allows one to determine the tuning parameters $c_1$ and $c_2$ for the heater currents $H_1$ and $H_2$ in Eq. 2.

The final piece of information that one needs to characterize the laser is to determine its gain tuning. This can be achieved by taking a temperature series. FIG. 16 depicts tuning of the laser using variations in the base temperature of the laser (i.e., by varying the current applied to heating resistor 110), where only the main side modes are drawn. It can be clearly seen from the lines formed by the side modes that the optical tuning of the effective cavity length (i.e., the combined lengths of linear ridge waveguide 15 and linear ridge waveguide 20) scales linearly with temperature. Moreover, one can read off the tuning of the center of the gain of the laser by considering how the center of the main modes, depicted in orange or red, lies on a line with a steeper slope. One sees that the optical tuning is about 0.2 nm/K while the gain tuning is about 14 nm/K. In this way, one can determine the tuning parameter a for the variable T in Eq. 2.

4. Characterization of a New Laser Design Vs. Characterization of Mass Produced Lasers of the Same Design It should be appreciated that there is typically a difference between the characterization of a new laser design and the characterization of mass produced lasers of the same design. A new laser design typically requires a detailed characterization, because one has to understand how process variations and material properties transform into the effective model parameters. However, once the process variations of a particular design and process route are understood and lasers of the same design are mass produced, one has a much simpler characterization problem. In this case one only needs to measure the "fine tuning". The simple laser characterization can then be reduced to an even shorter program (but of the same type as the program described above) which only measures a few properties of the laser to find the tuning parameters and locations of the base wavelengths with sufficient precision.

Alternative Constructions and Modes of Operation

In alternative constructions, one can consider lasers with more than two coupled cavities, lasers that possess only one heater at a coupled cavity, and lasers with several coupled cavities that possess heaters at each cavity or at only a subset of the cavities. The important part of the design is that the mode equation for the light mode possesses a scaling symmetry, such that a simple formula, analogous to that of Eq. 2, effectively describes the tuning behavior of the laser.

In alternative modes of operation, the operating mode may be adjusted due to the needs of the application. In particular, it may be desired to only scan a discrete set of wavelengths rather than to perform a number of wavelength sweeps.

Modifications of the Preferred Embodiments

It should be understood that many additional changes in the details, materials, steps and arrangements of parts, which have been herein described and illustrated in order to explain the nature of the present invention, may be made by those skilled in the art while still remaining within the principles and scope of the invention.

What is claimed is:

1. A widely tunable, single mode emission semiconductor laser comprising:
   a semiconductor substrate;
   a substrate heater for heating the semiconductor substrate;
   first and second linearly-aligned ridge waveguides formed on the semiconductor substrate, the first and second linearly-aligned ridge waveguides being separated by a gap so as to form first and second coupled cavities;
   first and second ridge waveguide heaters for heating the first and second linearly-aligned ridge waveguides, respectively; and
   first and second p-contacts formed on the first and second linearly-aligned ridge waveguides, respectively, and first and second n-contacts in electrical communication with the first and second linearly-aligned ridge waveguides, respectively, for applying first and second laser currents to the first and second linearly-aligned ridge waveguides, respectively.

2. A widely tunable, single mode emission semiconductor laser according to claim 1 further comprising a heat spreader, wherein the semiconductor substrate is mounted to the heat spreader, and further wherein the substrate heater is mounted to the heat spreader.

3. A widely tunable, single mode emission semiconductor laser according to claim 1 wherein heating of the semiconductor substrate, heating of the first and second linearly-aligned ridge waveguides and applying first and second laser currents to the first and second linearly-aligned ridge waveguides, respectively, simultaneously controls the output wavelength, output intensity and side-mode suppression ratio of the laser.

4. A widely tunable, single mode emission semiconductor laser according to claim 1 wherein the laser has a tuning ratio of $r \approx 0.1$.

5. A widely tunable, single mode emission semiconductor laser according to claim 1 wherein the semiconductor substrate comprises a layered structure suitable for laser emission.

6. A widely tunable, single mode emission semiconductor laser according to claim 5 wherein the layered structure comprises a laser diode.

7. A widely tunable, single mode emission semiconductor laser according to claim 1 wherein the semiconductor substrate comprises a III/V semiconductor material selected from the group consisting of gallium nitride (GaN), gallium arsenide (GaAs), indium phosphide (InP) and gallium antimonide (GaSb).

8. A widely tunable, single mode emission semiconductor laser according to claim 1 wherein the first and second linearly-aligned ridge waveguides have a height corresponding to a target wavelength.

9. A widely tunable, single mode emission semiconductor laser according to claim 1 wherein the first and second linearly-aligned ridge waveguides are spaced from one another by a gap which is about one-half a target wavelength.

10. A widely tunable, single mode emission semiconductor laser according to claim 1 wherein the first and second linearly-aligned ridge waveguides have a length which is between about 80 nm to about 800 nm.

11. A widely tunable, single mode emission semiconductor laser according to claim 1 wherein one of the first and second linearly-aligned ridge waveguides has a length which is greater than the other of the first and second linearly-aligned ridge waveguides.

12. A widely tunable, single mode emission semiconductor laser according to claim 1 wherein the first and second ridge waveguide heaters comprise a meandering structure.

13. A method for generating light of a selected wavelength, the method comprising:
   providing a semiconductor laser comprising:
      a semiconductor substrate;
      a substrate heater for heating the semiconductor substrate;
      first and second linearly-aligned ridge waveguides formed on the semiconductor substrate, the first and second linearly-aligned ridge waveguides being separated by a gap so as to form first and second coupled cavities;
      first and second ridge waveguide heaters for heating the first and second linearly-aligned ridge waveguides, respectively; and
      first and second p-contacts formed on the first and second linearly-aligned ridge waveguides, respectively, and first and second n-contacts in electrical communication with the first and second linearly-aligned ridge waveguides, respectively, for applying first and second laser currents to the first and second linearly-aligned ridge waveguides, respectively;
   tuning the wavelength of the semiconductor laser according to the equation $$\lambda = \lambda_i + aT + b_1 I_1 + b_2 I_2 + c_1 H_1^2 + c_2 H_2^2;$$

and
   adjusting at least one of T, $I_1$, $I_2$ and $H_1$, $H_2$ as necessary so as to generate light a selected wavelength.

14. A method according to claim 13 wherein the semiconductor laser is tuned by:
   using a combination of the heater currents $H_1$, $H_2$ to sweep a range of wavelengths;
   adjusting base temperature T of the laser by changing the current of the substrate heater to shift a gain maximum;
   adjusting laser currents $I_1$, $I_2$ to achieve a selected light output level;

adjusting a ratio between the laser currents $I_1$, $I_2$ to achieve an optimal side mode suppression ratio;

performing another sweep by varying the combination of heater currents $H_1$, $H_2$; and repeating the foregoing until an entire gain of the laser material is covered.

15. A method according to claim 13 wherein the laser is tuned by measuring a, $b_1$, $b_2$, $c_1$, $c_2$ and a discrete set of base wavelengths $\lambda_i$.

16. A method according to claim 15 wherein the discrete set of base wavelengths is between 4 and 20.

17. A method according to claim 13 wherein the first and second linearly-aligned ridge waveguides have a height corresponding to the selected wavelength.

18. A method according to claim 13 wherein the first and second linearly-aligned ridge waveguides are spaced from one another by a gap which is about one-half the selected wavelength.

19. A method according to claim 13 wherein the first and second linearly-aligned ridge waveguides have a length which is between about 80 nm to about 800 nm.

20. A method according to claim 13 wherein one of the first and second linearly-aligned ridge waveguides has a length which is greater than the other of the first and second linearly-aligned ridge waveguides.

21. A method according to claim 13 wherein the first and second ridge waveguide heaters comprise a meandering structure.

\* \* \* \* \*